(12) United States Patent
Kim

(10) Patent No.: US 6,930,447 B2
(45) Date of Patent: Aug. 16, 2005

(54) ORGANIC ELECTROLUMINESCENCE DEVICE

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/223,620

(22) Filed: Aug. 20, 2002

(65) Prior Publication Data

US 2003/0038592 A1 Feb. 27, 2003

(30) Foreign Application Priority Data

Aug. 21, 2001 (KR) ........................................ P2001-50325

(51) Int. Cl.[7] .................................................. H01J 1/62
(52) U.S. Cl. ...................... 313/505; 313/500; 313/503; 315/169.3
(58) Field of Search ................................. 313/503, 505, 313/506, 498, 500, 504; 315/169.3, 169.4

(56) References Cited

U.S. PATENT DOCUMENTS

| | | | | |
|---|---|---|---|---|
| 4,977,350 A | * | 12/1990 | Tanaka et al. | 313/505 |
| 5,399,936 A | * | 3/1995 | Namiki et al. | 313/504 |
| 6,140,766 A | * | 10/2000 | Okada et al. | 313/506 |
| 6,388,646 B1 | * | 5/2002 | Fujiwara et al. | 345/87 |
| 6,407,502 B2 | * | 6/2002 | Hidler | 313/505 |
| 6,614,177 B2 | * | 9/2003 | Kanno et al. | 313/506 |

* cited by examiner

Primary Examiner—Edward J. Glick
Assistant Examiner—Elizabeth Keaney
(74) Attorney, Agent, or Firm—Fleshner & Kim, LLP

(57) ABSTRACT

Organic EL device including a plurality of data electrode lines on a substrate, a plurality of scan electrode lines perpendicular to the data electrode lines, and an organic EL layer between the plurality of data electrode lines and the plurality of scan electrode lines, wherein each of the data electrode lines is patterned, and divided into at least two electrode lines in a width direction, and one the same time, divided into a length direction.

10 Claims, 6 Drawing Sheets

ORGANIC ELECTROLUMINESCENCE DEVICE

This application claims the benefit of the Korean Application No. P2001-0050325 filed on Aug. 21, 2001, which is hereby incorporated by reference.

BACKGROUND OF THE INVENTION

1. Field of the Invention

The present invention relates to an organic EL device, and more particularly, to an organic EL (electroluminescence) display, in which a number of scanlines are reduced in fabrication of a flat display panel, for increasing a light emitting time period per a pixel, to enhance a luminous efficiency and increase a numerical aperture.

2. Background of the Related Art

In a passive matrix organic EL device panel, the higher the resolution, the more the number of pixels, with the more number of scanlines and datalines accordingly. The more a number of scanlines, the shorter the light emitting time period per a pixel, to require a higher instantaneous luminance as much.

A positive strip is divided into two as shown in FIG. 1, and made to be scanned individually, for improving a luminous efficiency and a lifetime by reducing a number of scan by half. A positive strip is divided into two in a width direction each with a half width of the present width as shown in FIG. 2, for reducing a number of scanlines by half by forming a scan to have a width two times of the present scan width.

However, the methods in FIGS. 1 and 2 have a problem of high cost since data is divided into two parts, to require two data chips for the two parts. Moreover, the two methods permit to reduce a number of the scanlines only to half.

SUMMARY OF THE INVENTION

Accordingly, the present invention is directed to an organic EL display that substantially obviates one or more of the problems due to limitations and disadvantages of the related art.

An object of the present invention, designed for solving the foregoing problem, is to provide an organic EL display, in which a number of scanlines are significantly reduced, and a supplementary electrode is divided into a width direction and a length direction to increase a number of datalines driven when one scanline is applied in fabrication of a flat display panel, for enhancing a pixel luminous efficiency, and increasing a numerical aperture.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the organic EL device includes a plurality of data electrode lines on a substrate, a plurality of scan electrode lines perpendicular to the data electrode lines, and an organic EL layer between the plurality of data electrode lines and the plurality of scan electrode lines, wherein each of the data electrode lines is patterned, and divided into at least two electrode lines in a width direction, and one the same time, divided into a length direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
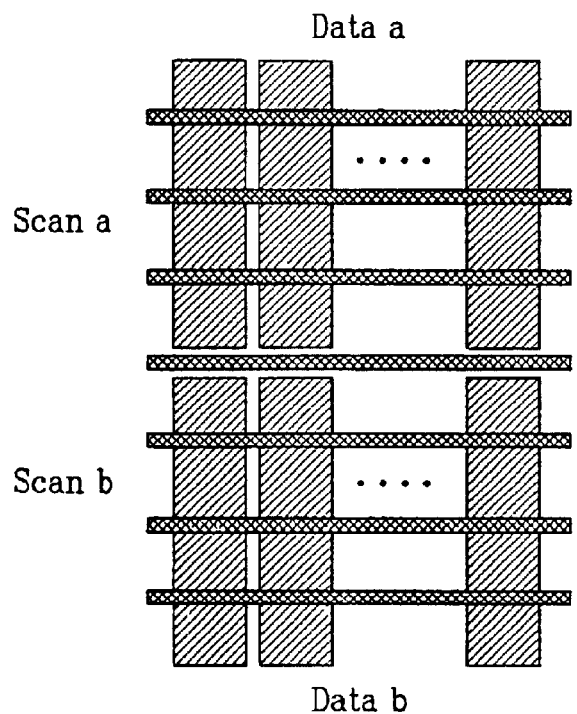
FIGS. 1 and 2 illustrate scan driving concepts of related art organic EL devices.
Figure 2:
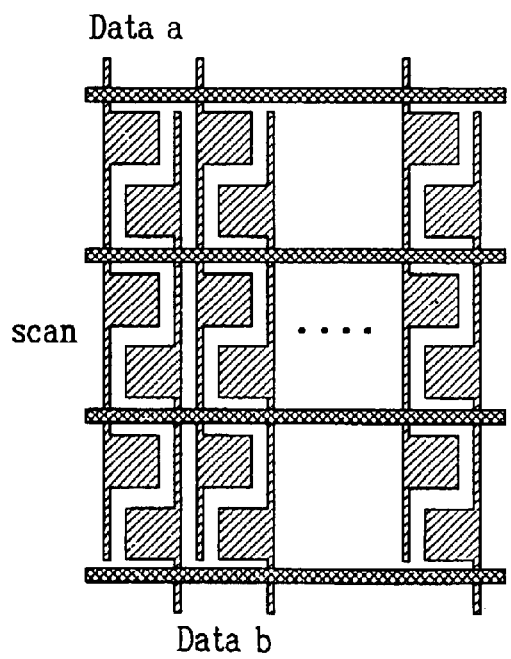
Figure 3:
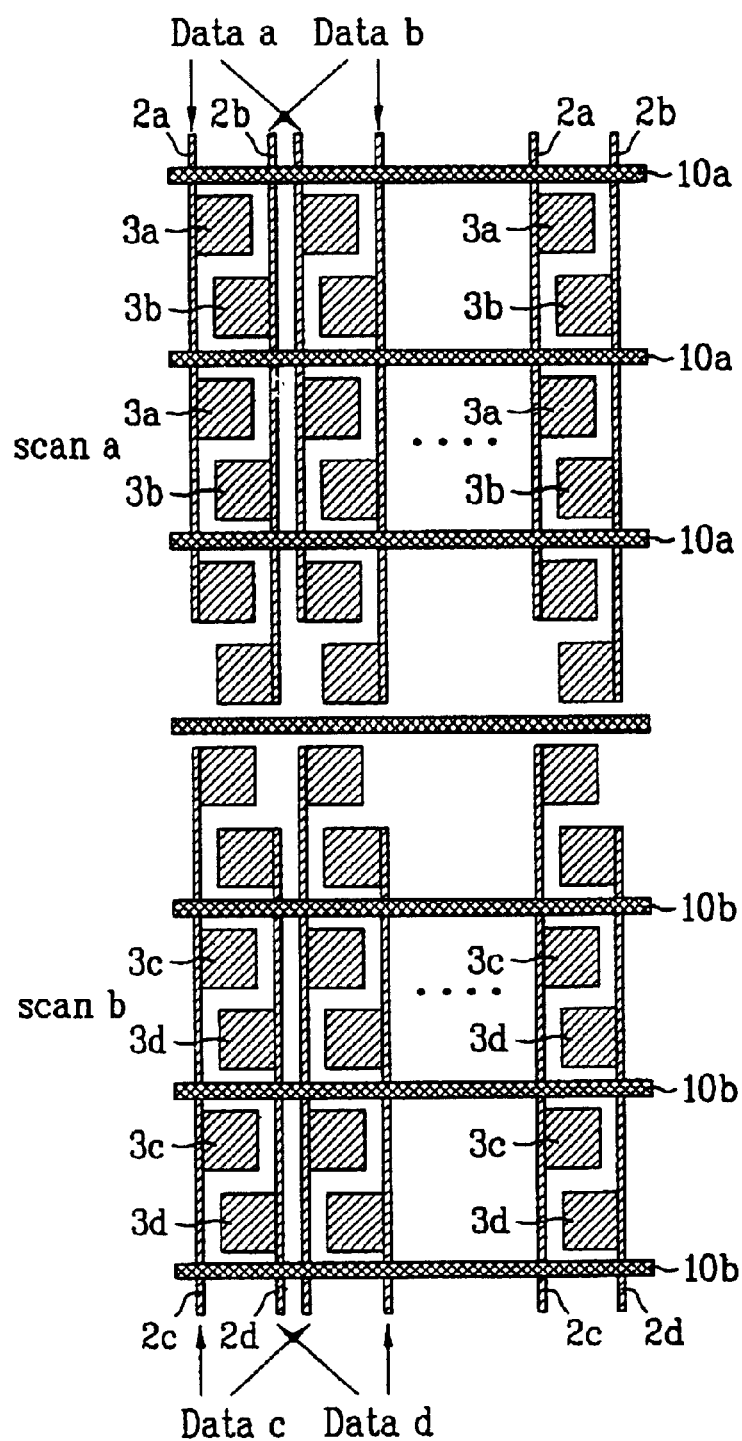
FIGS. 3 and 4 illustrate scan driving concepts of organic EL devices in accordance with preferred embodiments of the present invention.
Figure 4:
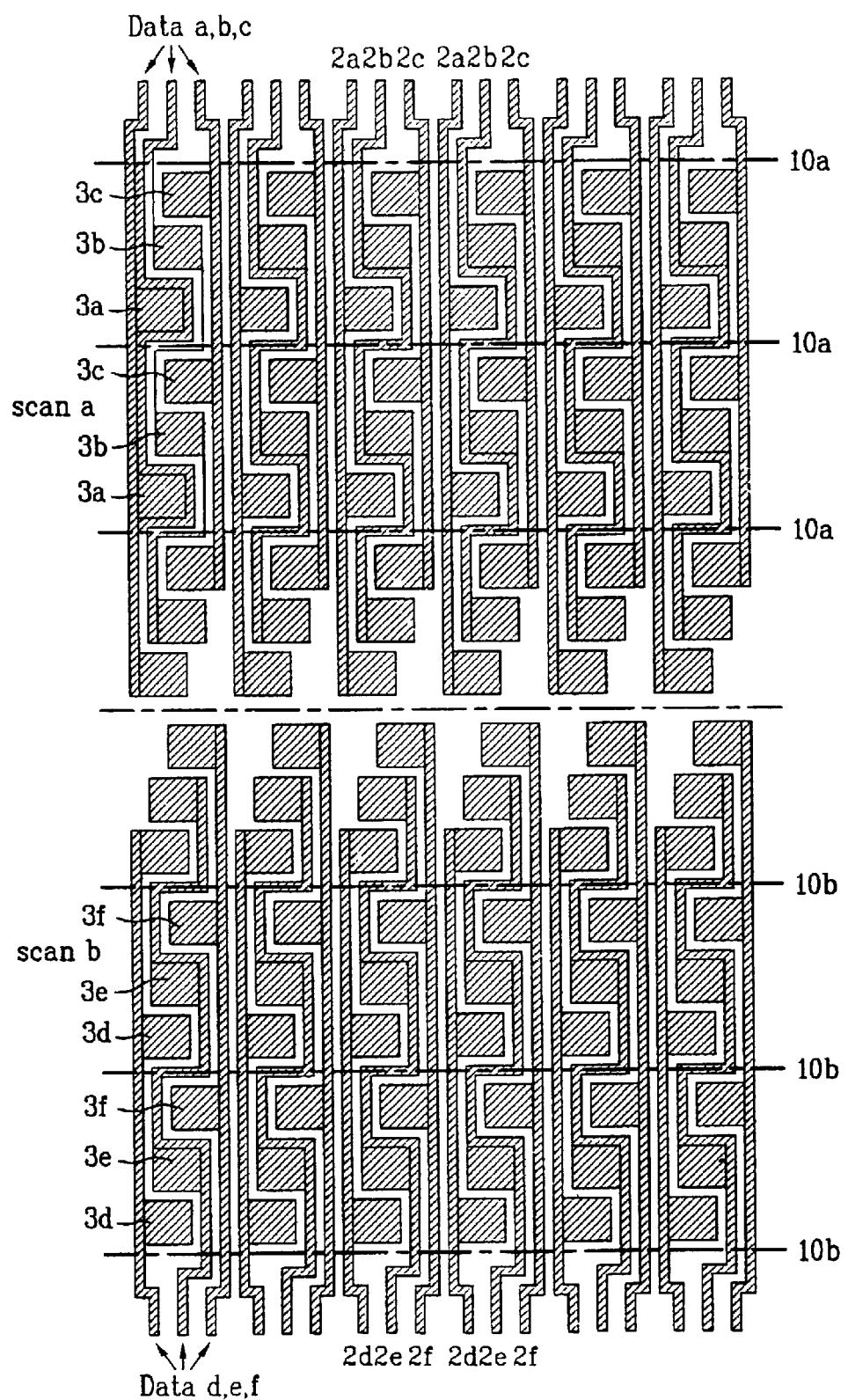

Reference will now be made in detail to the preferred embodiments of the present invention, examples of which are illustrated in the accompanying drawings. FIGS. 3 and 4 illustrate scan driving concepts of organic EL devices in accordance with preferred embodiments of the present invention.

Referring to FIG. 3, the organic EL device includes a substrate, a matrix of first electrodes (not shown) and second electrodes 10a, and 10b on the substrate, for dividing the second electrodes into to regions scan a, and scan b in scanning the electrode lines in a same divided regions on the same time, and at least two lines of supplementary electrodes 2a, and 2b; 2c, and 2d in a direction perpendicular to pixel groups 3a, 3b, 3c, and 3d arranged in a length direction of the second electrodes 10a, and 10b for every one of the pixel groups 3a, 3b, 3c, and 3d, each for controlling at least two pixel groups, independently.

Each line of the supplementary electrodes is divided into sublines 2a, 2b, 2c, and 2d in a length direction and a width direction of the supplementary electrode line.

That is, when a scan signal is applied to at least two second electrodes each one in each of divided second electrodes 10a, and 10b scan a, and scan b 10a, and 10b, the supplementary electrodes 2a, 2b, 2c, and 2d apply data signals different from one another to the at least four sublines divided in a length direction and a width direction.

In other words, a whole picture displayed by the organic EL display is divided into two parts, so that the scan a and scan b are scanned on the same time, and the scan a part has data signals data a, and data b applied to the supplementary electrodes 2a, and 2b divided into the width direction, and the scan b part has data signals data c, and data d applied to the supplementary electrodes 2c, and 2d divided into a width direction, thereby making four pixels to emit lights for one scan time period.

Therefore, by dividing one supplementary electrode into more than four, a duty number more than a quarter is reduced, and, accordingly, a time period of light emission per one pixel 3a, 3b, 3c, or 3d increases.

Similar to FIG. 3, FIG. 4 illustrates second electrodes 10a, and 10b divided into two regions scan a and scan b, to each of the electrode lines in the divided regions a scan signal is applied on the same time.

Of the supplementary electrodes 2a, 2b, 3c; 2d, 2e, 2f, there are three lines of supplementary electrodes for every pixel groups 3a, 3b, 3c, 3d, 3e, and 3f arranged in the length direction of the second electrodes 10a, and 10b, for independent control of adjacent three pixel groups. The three lines of supplementary electrodes include the sublines 2a, 2b, and 2c, and 2d, 2e, and 2f divided by the electrodes 10a, and 10b scanned on the same time.

That is, when the second electrodes 10a, and 10b are divided into two regions scan a, and scan b, and a scan signal is applied to at least two second electrodes on the same time, data signals different from one another are applied to at least six sublines which are division of the supplementary electrodes in a length direction and a width direction.

In other words, a whole picture displayed by the organic EL display is divided into two parts, so that scan a, and scan b are scanned on the same time, and the scan a part has data signals data a, and data b applied to the supplementary electrodes 2a, 2b, and 2c divided in a width direction, and the scan b part has data signals data d, data e, and data f applied to the supplementary electrodes 2d, 2e, and 2f, for making six pixels to emit lights for one scan time period.

Therefore, by dividing one supplementary electrode into more than six, a duty number more than one sixths is reduced, and, accordingly, a time period of light emission per one pixel 3a, 3b, 3c, 3d, 3e, and 3f increases.

Figure 5A:
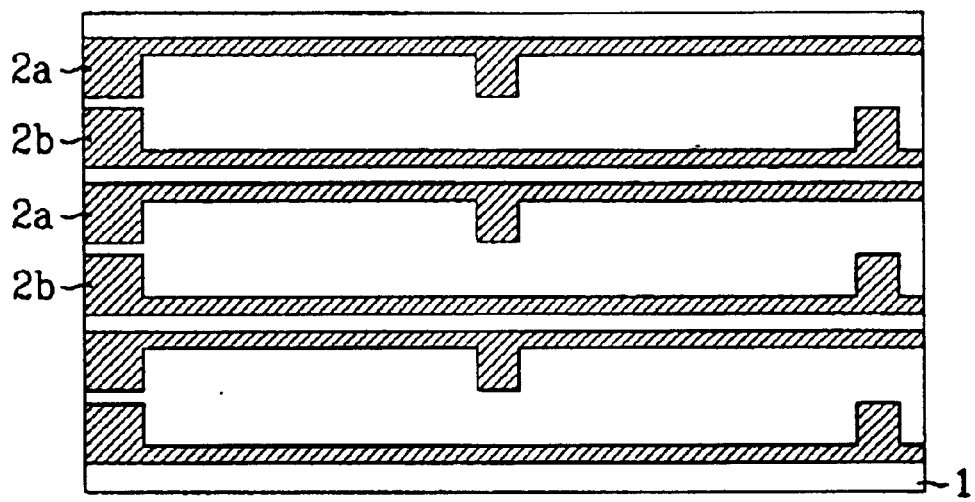
FIGS. 5A–5E illustrate a first preferred embodiment of the present invention according to the concept in FIG. 3.
Figure 5B:
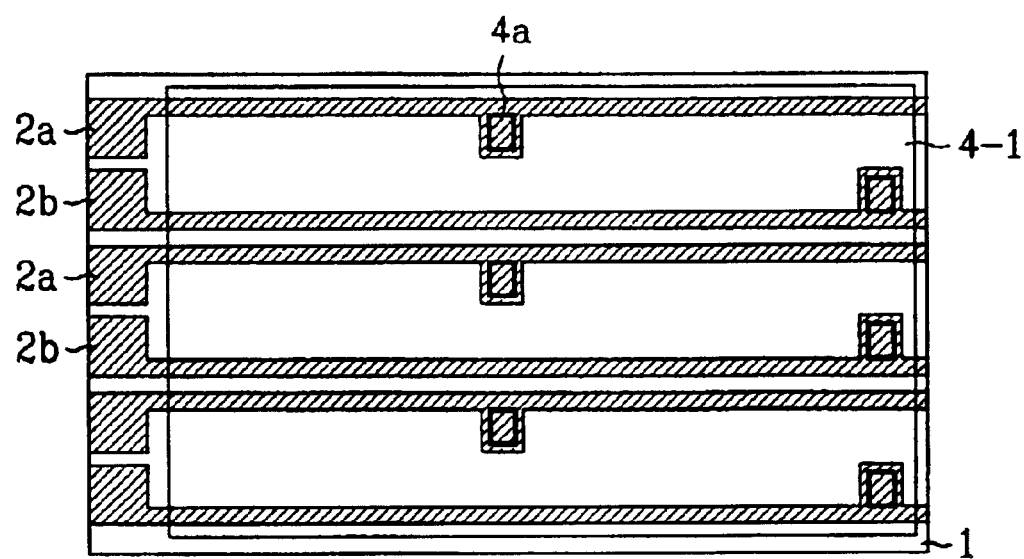
Figure 5C:
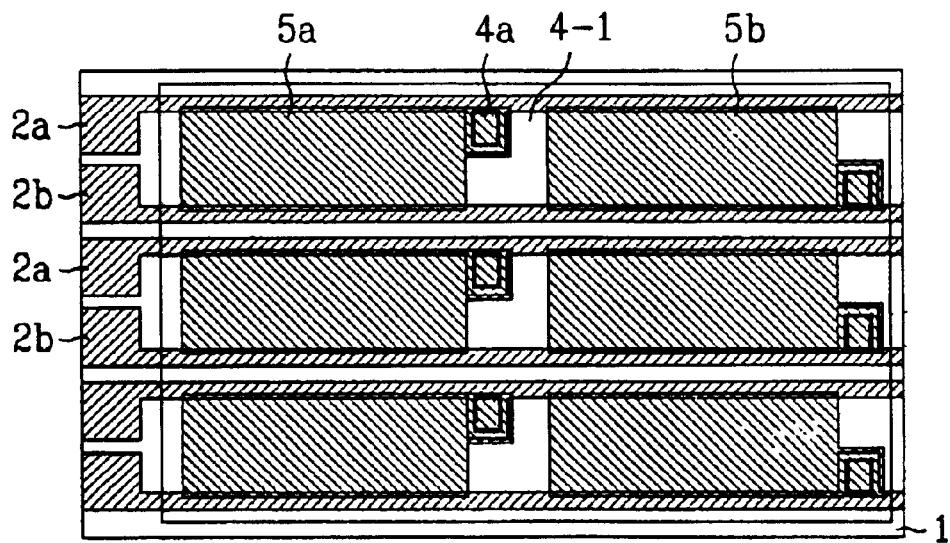
Figure 5D:
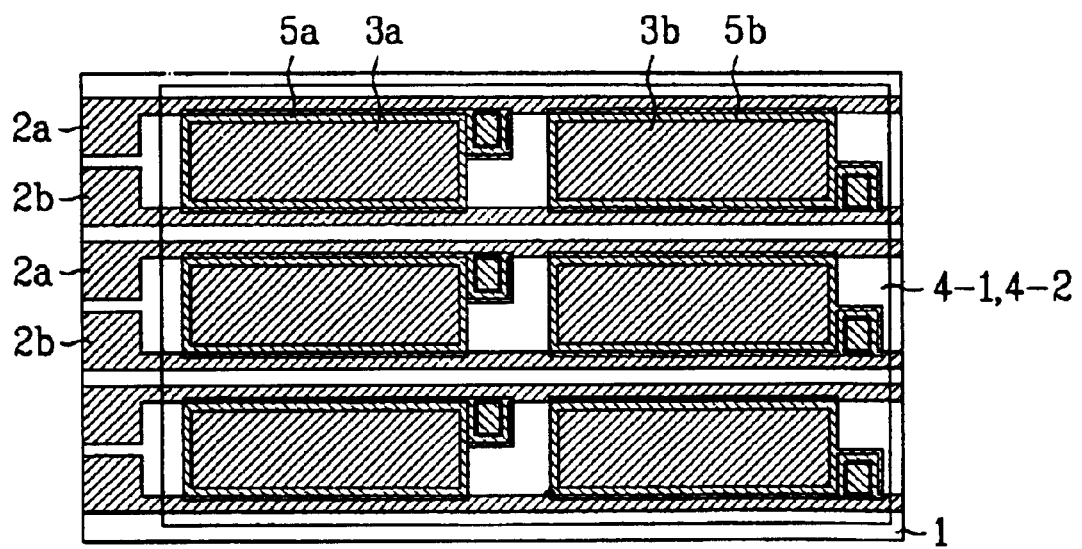
Figure 5E:
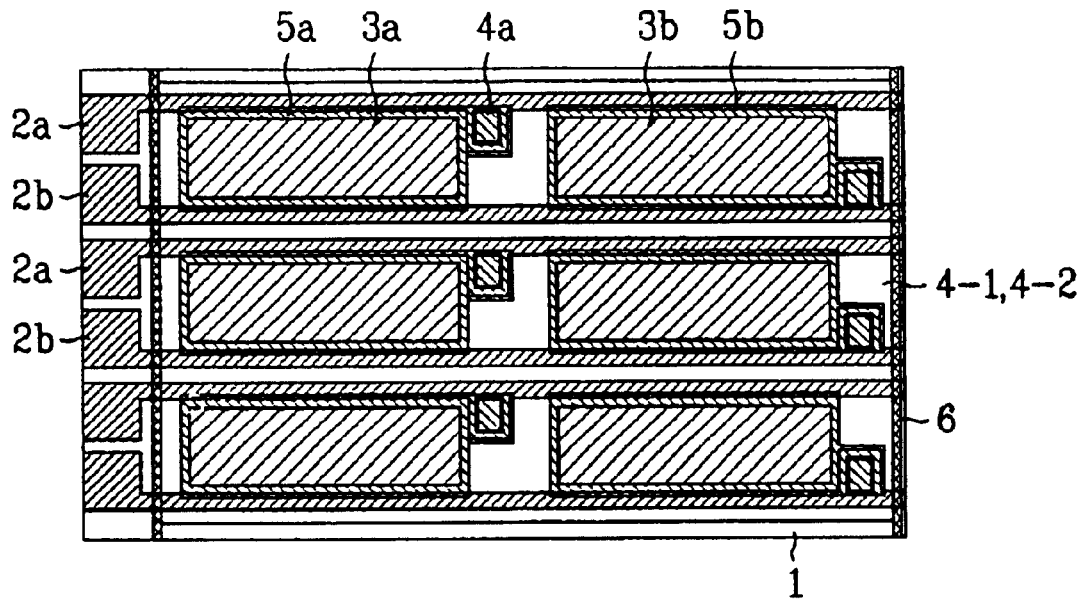

FIGS. 5A–5E illustrate a first preferred embodiment of the present invention according to the concept in FIG. 3, showing plan views of the steps of a method for fabricating an organic EL display. FIG. 5E illustrates either one of the scan a and scan b in the conceptual drawing of FIG. 3.

Referring to FIG. 5E, the organic EL display includes a substrate 1, at least two lines of supplementary electrodes 2a, and 2b for every one pixel group in a direction perpendicular to pixel groups arranged in one direction in regions first electrodes 5a, and 5b and a second electrode (not shown) cross, each connected to at least two adjacent pixel groups, wherein each of the supplementary electrodes 2a, and 2b has a via hole 4a to expose an upper region of the supplementary electrode 2a, or 2b for respectively controlling at least two pixel groups 3a, and 3b, a first insulating film 4-1 on the first electrode, first electrodes 5a, and 5b patterned at each pixel inclusive of the via hole 4a so as to connect to the supplementary electrodes 2a, and 2b, an organic EL layer (not shown) over the first electrodes 5a, and 5b, and a second electrode (not shown) on the organic EL layer.

The organic EL display further includes a second insulating film 4-2 on the substrate 1 to cover an edge part of a first electrode 5 pattern, and a barrier 6 formed for every two pixel groups arranged in one direction such that the second electrode is electrically isolated for every two pixel groups for scan driving the two pixel groups on the same time.

Each of the supplementary electrodes 2a, and 2b includes a bar of a stripe pattern, and a projection connected to the bar for controlling one of the at least two adjacent pixel groups.

The insulating film 4-1 has a via hole 4a at a location of the projection of the supplementary electrodes 2a, or 2b, and is extended to the substrate 1. The supplementary electrode 2a, or 2b is connected to the first electrode 5 electrically through the via hole 4a.

Figure 6:
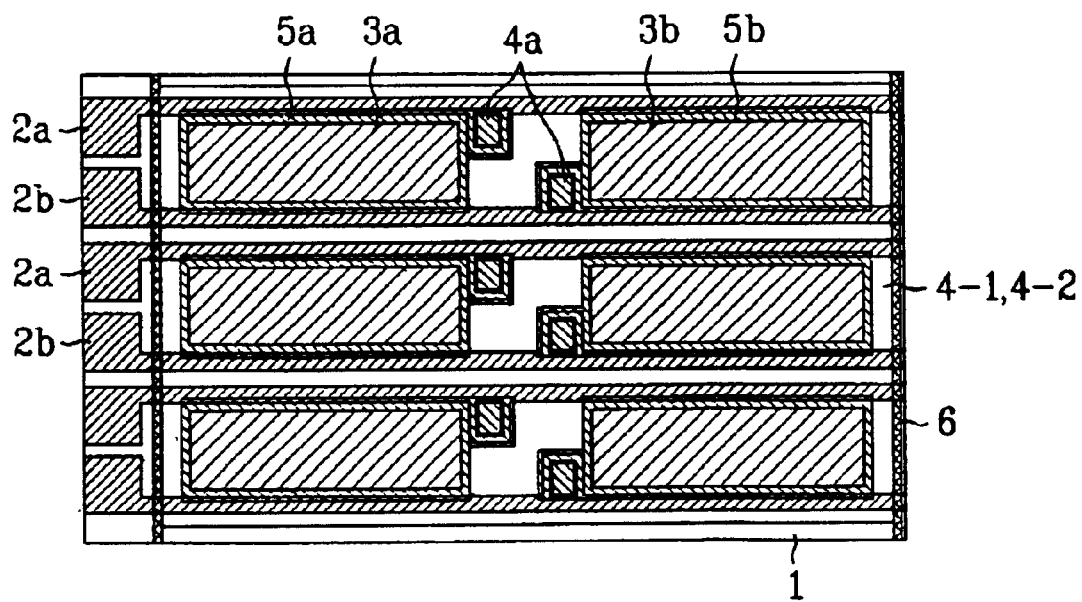
FIG. 6 illustrates a second preferred embodiment of the present invention according to the concept in FIG. 3.

The supplementary electrode 2a, or 2b may have one projection for every one pixel group individually as shown in FIG. 5E, or two for adjacent pixel groups as shown in FIG. 6.

FIG. 6 illustrates a second embodiment of the present invention for the conceptual drawing of FIG. 3, of which explanation of system and fabrication method, which are identical to the first embodiment, will be omitted.

Alike the first, or second embodiment, by forming the via hole in the projection of the supplementary electrode for making electric contact with the supplementary electrode, the pixel numerical aperture and pixel luminous efficiency can be increased.

A method for fabricating an organic EL device will be explained, with reference to FIGS. 5A–5E.

Referring to FIG. 5A, two parallel lines of supplementary electrodes 2a, and 2b having a projection region a are formed on the substrate 1 perpendicular to the scanline for every one pixel group in a scanline direction, for controlling an odd numbered pixel 3a and an even numbered pixel 3b, respectively.

Then, referring to FIG. 5B, a first insulating film 4-1 having a via hole 4a for exposing a part of the projection region of the two lines of adjacent supplementary electrodes 2a, or 2b is formed so that the two lines of supplementary electrodes 2a, and 2b control the odd numbered pixel 3a and the even numbered pixel 3b, respectively.

Then, referring to FIG. 5C, a first electrode 5 inclusive of a via hole 4a in contact with the supplementary electrodes 2a, or 2b is formed over the supplementary electrode 2a, or 2b by patterning a transparent conductive material, for controlling the odd numbered pixel 3a and the even numbered pixel 3b of the two lines of supplementary electrodes 2a, or 2b, respectively.

Referring to FIG. 5D, a second insulating film 4-2 is formed on the substrate 1 additionally to cover an edge part of the first electrode pattern 5.

Referring to FIG. 5E, a barrier 6 is formed for electric isolation of the second electrode for every two pixel groups so that the two pixel groups arranged in one direction are connected to an external scanline (not shown), and driven on the same time.

An organic EL layer (not shown) is formed over the first electrode 5.

That is, the barrier 6 is formed for every two pixel 3a, and 3b groups in a direction perpendicular to the supplementary electrodes 2a, and 2b, a second electrode (not shown) is formed on the organic EL layer, and passivation and encapsulation are carried out, to finish fabrication of a display.

The method further includes a step for connecting one scanline to every two adjacent pixel groups in a direction perpendicular to the supplementary electrodes 2a, and 2b for scan driving the adjacent two pixel groups on the same time among pixel groups arranged in one direction.

As a material of the supplementary electrode, it is acceptable as far as the material is conductive, particularly, Cr, Mo, Al, Cu, or an alloy of them, or more than two of them. The supplementary electrode may have a thickness in a range of 0.01–10 $\mu$m, and a line width different depending on devices.

The insulating film 4-1, or 4-2 may be formed of inorganic, or organic material, such as oxides SiO2, nitrides SiNx as the inorganic material, and polymer (particularly, polyacryl group, polyimide group, novolac, polyphenyl, polystyrene) as the organic material. The insulating film 4-1, or 4-2 may have a thickness in a range of 0.01–10 $\mu$m, and is preferably formed of a material having a low light absorbency for a visible light.

It is required that a part of the first electrode 5a, or 5b in a light emission region is covered with the insulating film 4-2, for prevention of damage of the edge part during fabrication, thereby preventing short circuit between the first electrode 5a, and 5b and the second electrode.

The first electrode 5a, or 5b is transparent, and the second electrode is formed of metal.

As has been explained, the organic EL display of the present invention has the following advantages.

By reducing a number of scanlines significantly, dividing a supplementary electrode in a width direction and a length direction in fabrication of a flat display panel, and increasing a number of datalines driven when one scanline is scanned, a pixel luminous efficiency, and a pixel numerical aperture are increased.

It will be apparent to those skilled in the art that various modifications and variations can be made in the organic EL display of the present invention without departing from the spirit or scope of the invention. Thus, it is intended that the present invention cover the modifications and variations of this invention provided they come within the scope of the appended claims and their equivalents.

What is claimed is:

1. An organic EL (electroluminescence) device comprising:
   a plurality of data electrode lines on a substrate;
   a plurality of scan electrode lines perpendicular to the data electrode lines; and
   an organic EL layer between the plurality of data electrode lines and the plurality of scan electrode lines,
      wherein each of the data electrode lines is patterned, and divided into at least two electrode lines in a width direction and a length direction, and wherein each of the data electrode lines includes:
         a plurality of supplementary electrode lines in a direction perpendicular to a direction of scan electrode lines,
         a first insulating film having via holes formed on the plurality of supplementary electrode lines, and
         a plurality of main electrode lines formed on the first insulating film and connected to the plurality of supplementary electrode lines through the via holes, wherein the data electrode lines are formed so that supplementary electrodes are divided into two electrodes in up and down directions and driven at the same time.

2. The organic EL device as claimed in claim 1, wherein the main electrodes are formed of ITO.

3. The organic EL device as claimed in claim 1, further comprising a second insulating film formed on the plurality of main electrode lines to expose only the surface of the main electrode lines of pixel regions.

4. The organic EL device as claimed in claim 1, wherein the data electrode lines are patterned, and divided into two or three portions.

5. The organic EL device as claimed in claim 4, wherein the data electrode lines are divided in up and down directions.

6. The organic EL device as claimed in claim 1, wherein each of said data electrode lines is divided into more than two electrode lines in the width direction.

7. The organic EL device as claimed in claim 1, wherein a pixel group has at least three supplemental electrode lines and two scan electrode lines forming at least six sublines, wherein a pixel group has at least six pixels, and wherein said at least six pixels emit light for a single scan time period.

8. The organic EL device as claimed in claim 1, wherein the supplementary electrode lines are electrically connected to at least one data driver.

9. The organic EL device as claimed in claim 1, wherein the first insulating film is formed of SiO2, SiNx and polymer, such as polyacryl group, polyimide group, novolac, polyphenyl and polystyrene.

10. An organic EL (electroluminescence) device comprising:
    a plurality of data electrode lines on a substrate;
    a plurality of scan electrode lines perpendicular to the data electrode lines; and
    an organic EL layer between the plurality of data electrode lines and the plurality of scan electrode lines,
       wherein each of the data electrode lines is patterned, and divided into at least three electrode lines in a width direction and a length direction, and wherein each of the data electrode lines includes:
          a plurality of supplementary electrode lines in a direction perpendicular to a direction of scan electrode lines,
          a plurality of main electrode lines connected to the plurality of supplementary electrode lines for driving pixels respectively, wherein a pixel group has at least three supplemental electrode lines and two scan electrode lines forming at least six sublines, wherein a pixel group has at least six pixels, and wherein said at least six pixels emit light for a single scan time period.

* * * * *